United States Patent
Lee et al.

(10) Patent No.: US 9,406,901 B2
(45) Date of Patent: Aug. 2, 2016

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Ung-Soo Lee, Yongin (KR); Jae-Sun Lee, Yongin (KR); Hun Kim, Yongin (KR); Jai-Hyuk Choi, Yongin (KR); Su-Hyuk Choi, Yongin (KR); Jin-Woo Park, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 149 days.

(21) Appl. No.: 13/966,237

(22) Filed: Aug. 13, 2013

(65) Prior Publication Data

US 2014/0312313 A1  Oct. 23, 2014

(30) Foreign Application Priority Data

Apr. 18, 2013 (KR) .................. 10-2013-0043031

(51) Int. Cl.
  *H01L 21/00* (2006.01)
  *H01L 51/52* (2006.01)
  *H01L 27/32* (2006.01)

(52) U.S. Cl.
  CPC ........ *H01L 51/5237* (2013.01); *H01L 51/5253* (2013.01); *H01L 27/3244* (2013.01)

(58) Field of Classification Search
  CPC ............ H01L 51/5237; H01L 51/5253; H01L 27/3244
  See application file for complete search history.

(56) References Cited

U.S. PATENT DOCUMENTS

| | | | | |
|---|---|---|---|---|
| 6,306,783 | B1* | 10/2001 | Yamanaka | C03C 3/064 501/15 |
| 7,722,929 | B2 | 5/2010 | Aitken et al. | |
| 7,927,713 | B2 | 4/2011 | Ye | |
| 2008/0080019 | A1 | 4/2008 | Hayashi et al. | |
| 2008/0149924 | A1* | 6/2008 | Aitken | C03C 3/12 257/40 |
| 2008/0271988 | A1 | 11/2008 | Hosoda et al. | |
| 2012/0325789 | A1* | 12/2012 | Masuda | C03C 8/08 219/121.85 |
| 2013/0229107 | A1* | 9/2013 | Park | H01L 51/5253 313/504 |

FOREIGN PATENT DOCUMENTS

| | | |
|---|---|---|
| KR | 10-2011-0120980 A | 11/2001 |
| KR | 10-2007-0045191 A | 5/2007 |
| KR | 10-2008-0045217 A | 5/2008 |

* cited by examiner

*Primary Examiner* — Laura Menz
(74) *Attorney, Agent, or Firm* — Lewis Roca Rothgerber Christie LLP

(57) ABSTRACT

An organic light-emitting display apparatus and a method of manufacturing the organic light-emitting display apparatus. The organic light-emitting display apparatus includes a substrate; a display unit on the substrate; and an encapsulating layer encapsulating the display unit. The encapsulating layer is formed of a low-temperature viscosity transition inorganic material. The encapsulating layer includes nitrogen.

9 Claims, 2 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0043031, filed on Apr. 18, 2013, in the Korean Intellectual Property Office, the disclosure of which is incorporated herein in its entirety by reference.

BACKGROUND

1. Field

Embodiments of the present invention relates to an organic light-emitting display apparatus, and more particularly, to an organic light-emitting apparatus including an encapsulating layer having improved light transmission and improved encapsulation characteristics, and a method of manufacturing the organic light-emitting apparatus.

2. Description of the Related Art

An organic light-emitting display apparatus is a self-emissive display apparatus that includes an organic light-emitting device (OLED), the OLED including a hole injecting electrode, an electron injecting electrode, and an organic light-emitting layer formed between the hole injecting electrode and electron injecting electrode. In the organic light-emitting display apparatus, holes injected from the hole injecting electrode and electrons injected from the electron injecting electrode are combined in the organic light-emitting layer to generate excitons, and the excitons fall from an excited state to a ground state and generate light.

The organic light-emitting display apparatus, which is a self-emissive display apparatus, does not require a separate light source. Therefore, the organic light-emitting display apparatus is capable of operating at a low voltage, is lightweight and thin, and provides high-quality features such as a wide viewing angle, high contrast and a fast response. Thus, the organic light-emitting display apparatus has drawn attention as a next-generation display apparatus.

However, the organic light-emitting display apparatus may be degraded due to external moisture or oxygen, and the like. Therefore, the organic light-emitting device should be encapsulated to protect the OLED from external moisture or oxygen, and the like. Also, an encapsulating layer that encapsulates the OLED should maintain at least a certain level of light transmission.

SUMMARY

Embodiments of the present invention provide an organic light-emitting apparatus including an encapsulating layer having improved light transmission and improved encapsulation characteristics, and a method of manufacturing the organic light-emitting apparatus.

According to an aspect of the present invention, there is provided an organic light-emitting display apparatus including a substrate; a display unit on the substrate; and an encapsulating layer encapsulating the display unit; in which the encapsulating layer is formed of a low-temperature viscosity transition inorganic material; and in which the encapsulating layer comprises nitrogen.

The encapsulating layer may include tin oxide $SnO_2$.

The encapsulating layer may further include at least one of $P_2O_5$, $BPO_4$, $SnF_2$, or $WO_3$.

The amount of $SnO_2$ may be larger in a surface of the encapsulating layer than a region near the display unit.

The encapsulating layer may also be formed on the substrate.

According to another aspect of the present invention, there is provided an organic light-emitting display apparatus including a substrate; a display unit on the substrate; and an encapsulating layer encapsulating the display unit; in which the encapsulating layer comprises a first encapsulating layer and second encapsulating layer that are sequentially stacked; in which the first and second encapsulating layers are formed of a low-temperature viscosity transition inorganic material; and in which the first encapsulating layer includes nitrogen.

The first and second encapsulating layers may include tin oxide.

The amount of tin oxide in the second encapsulating layer may be larger than in the first encapsulating layer.

A thickness of the second encapsulating layer may be greater than the thickness of the first encapsulating layer.

According to another aspect of the present invention, there is provided a method of manufacturing an organic light-emitting display apparatus, the method including forming a display unit on a substrate; and forming an encapsulating layer encapsulating the display unit; in which the forming of the encapsulating layer includes depositing a low-temperature viscosity transition inorganic material on the display unit by sputtering, and healing the deposited low temperature viscosity transition inorganic material; and by injecting argon gas and nitrogen gas together during the sputtering.

The ratio between the injection amount of nitrogen gas to that of argon gas may range from about 0.005 to about 0.1.

The method according to another aspect of the present invention further includes forming a second encapsulating layer on the encapsulating layer, in which the second encapsulating layer may be formed by depositing the low-temperature viscosity transition inorganic material by sputtering.

When forming the second encapsulating layer, argon gas and oxygen gas may be injected together.

The low-temperature viscosity transition inorganic material may include tin oxide.

The low-temperature viscosity transition inorganic material may further include at least one of $P_2O_5$, $BPO_4$, $SnF_2$, or $WO_3$.

The amount of $SnO_2$ in the second encapsulating layer is larger than that in the first encapsulating layer.

A thickness of the second encapsulating layer may be greater than that of the first encapsulating layer.

The method according to another aspect of the present invention further includes simultaneously healing the encapsulating layer and second encapsulating layer, after the forming of the second encapsulating layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
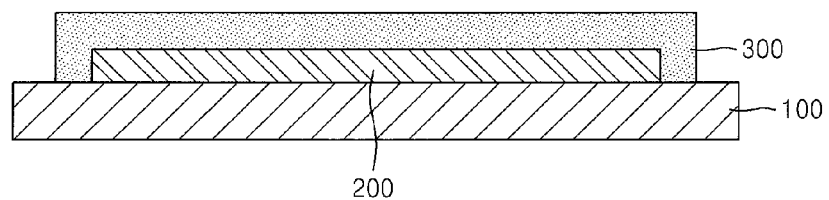
FIG. 1 is a cross-sectional view illustrating an organic light-emitting display apparatus according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the description of the present invention, if it is determined that a detailed description of commonly-used technologies or structures related to the invention may unnecessarily obscure the subject matter of the present invention, the detailed description thereof will be omitted.

It will be understood that although the terms first and second are used herein to describe various elements, these elements should not be limited by these terms. These terms are only used to distinguish one element from another element.

It will be understood that when an element or layer is referred to as being "on" another element or layer, the element or layer can be directly on another element or layer or intervening elements or layers.

As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments of the present invention will be described in detail with reference to the drawings. Like reference numerals in the drawings denote like elements, and thus their description will be omitted. In the drawings, the thicknesses of layers and regions are exaggerated for clarity.

Figure 2:
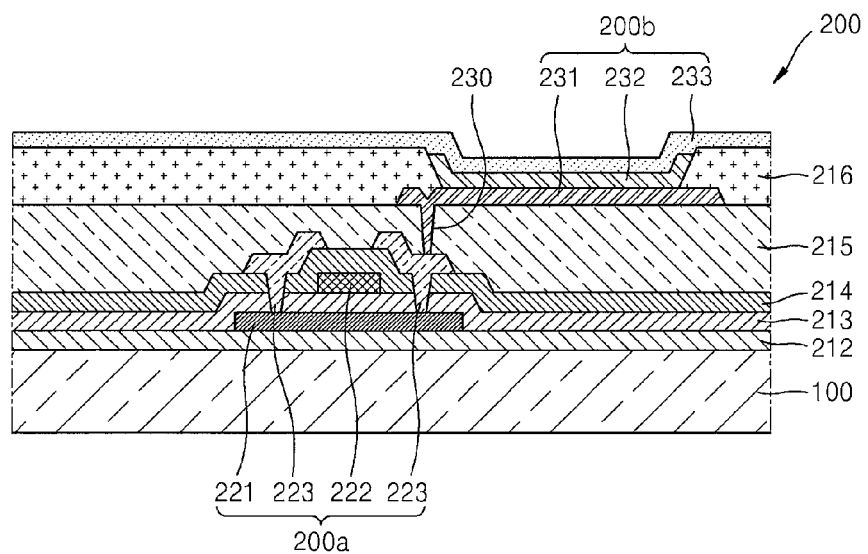
FIG. 2 is a cross-sectional view illustrating a display unit of the organic light-emitting display apparatus of FIG. 1.

FIG. 1 is a cross-sectional view illustrating an organic light-emitting display apparatus 10 according to an embodiment of the present invention. FIG. 2 is a cross-sectional view illustrating a display unit 200 of the organic light-emitting display apparatus 10 of FIG. 1.

Referring to FIG. 1, the organic light-emitting display apparatus 10 may include a substrate 100, a display unit 200 formed on the substrate 100, and an encapsulating layer 300 encapsulating the display unit 200.

The substrate 100 may be formed of a transparent glass material which may include $SiO_2$ as a main element. However, the material of the substrate 100 is not limited thereto, and the substrate 100 may be formed of a transparent plastic material. The plastic material used to form the substrate 100 may be an insulating organic material, for example, polyethersulphone (PES), polyacrylate (PAR), polyetherimide (PEI), polyethylenennapthalate (PEN), polyethyelneterepthalate (PET), polyphenylenesulfide (PPS), polyallylate, polyimide, polycarbonate (PC), cellulosetriacetate (TAC), or celluloseacetatepropionate (CAP).

If the substrate 100 is a bottom-emission type in which an image is displayed toward the substrate 100, the substrate 100 is formed using a transparent material. However, if the substrate 100 is a top-emission type in which an image is displayed in a direction directed away from the substrate 100, the substrate 100 does not need to be formed using a transparent material. In this case, the substrate 100 may be formed of a metal. If the substrate 100 is formed of a metal, the substrate 100 may be formed of a metal including at least one of carbon (C), steel, chromium (Cr), manganese (Mn), nickel (Ni), titanium (Ti), molybdenum (Mo), and stainless steel (SUS), but is not limited thereto.

The display unit 200 may include an organic thin film transistor (TFT) layer 200a and pixel unit 200b. The pixel unit 200b may be an organic light-emitting device (OLED). Hereinafter, the display unit 200 will be described in detail with reference to FIG. 2.

A buffer layer 212 may be formed on the substrate 100. The buffer layer 212 blocks impurities from entering via the substrate 100, and planarize a top surface of the substrate 100. The buffer layer 212 may be formed of any material as long as it performs these functions. For example, the buffer layer 212 may include an inorganic material such as silicon oxide, silicon nitride, silicon oxynitride, aluminum oxide, aluminum nitride, titanium oxide, or titanium nitride, or an organic material such as polyimide, polyester, or acryl. The buffer layer 212 may be a stack of two or more of the aforementioned materials.

The buffer layer 212 may be formed using various deposition methods such as plasma enhanced chemical vapor deposition (PECVD), atmospheric pressure chemical vapor deposition (APCVD), or low pressure chemical vapor deposition (LPCVD).

An active layer 221 may be formed of an inorganic semiconductor such as silicon, or an organic semiconductor, on the buffer layer 212. Also, the active layer 221 may include a source region, a drain region, and/or a channel region between the source and drain regions. For example, when using amorphous silicon to form the active layer 221, the active layer 221 including the source region, drain region, and/or the channel region therebetween may be formed by forming an amorphous silicon layer on the entire surface of the substrate 100, crystallizing the amorphous silicon layer to form a polycrystalline silicon layer, patterning the polycrystalline silicon layer, and doping the boundaries of the source and drain regions with impurities.

A gate insulating layer 213 may be formed on the active layer 221. The gate insulating layer 213 is provided to insulate the active layer 221 from a gate electrode 222, and may be formed of an inorganic material such as SiNx or $SiO_2$.

The gate electrode 222 may be formed on a predetermined region of an upper surface of the gate insulating layer 213. The gate electrode 222 is connected to a gate line (not shown) which applies on/off signals of a thin film transistor (TFT).

The gate electrode 222 may include, but is not limited thereto, gold (Au), silver (Ag), copper (Cu), nickel Ni, platinum (Pt), palladium (Pd), aluminum (Al), molybdenum (Mo), or an alloy such as a Al—Nd alloy, or a Mo—W alloy. The gate electrode 222 may include various materials in consideration of the design conditions of the organic light-emitting display apparatus 10.

An interlayer insulating layer 214 may be formed on the gate electrode 222, to insulate the gate electrode 222 from source and drain electrodes 223. The interlayer insulating layer 214 may be formed of an inorganic material such as SiNx or $SiO_2$.

The source and drain electrodes 223 may be formed on the interlayer insulating layer 214. In detail, the interlayer insulating layer 214 and the gate insulating layer 213 expose source and drain regions of the active layer 221. The source and drain electrodes 223 contact the exposed source and drain regions of the active layer 221.

FIG. 2 illustrates a top-gate type TFT which sequentially includes the active layer 221, the gate electrode 222, and the source and drain electrodes 223. However, the present invention is not limited thereto. The gate electrode 222 may be provided under the active layer 221.

The TFT layer 200a as described above is electrically connected to the pixel unit 200b and operates the pixel unit 200b, and is covered with a planarization layer 215 to protect the TFT layer 200a.

The planarization layer 215 may be an inorganic insulating layer and/or an organic insulating layer. The inorganic insulating layer may include $SiO_2$, SiNx, SiON, $Al_2O_3$, $TiO_2$, $Ta_2O_5$, $ZrO_2$, BST, or PZT. The organic insulating layer may include a general purpose polymer (e.g., poly(methyl methacrylate) (PMMA) or polystyrene (PS)), a polymer derivative including a phenol-based group, an acryl-based polymer, an arylether-based polymer, an amide-based polymer, a fluorine-based polymer, a p-xylene-based polymer, a vinyl alcohol-based polymer, or a mixture thereof. Also, the planarization layer 215 may be a composite stack of inorganic and organic layers.

The pixel unit 200b may be formed on the planarization layer 215. The pixel unit 200b may include a pixel electrode 231, an intermediate layer 232, and an opposite electrode 233.

The pixel electrode 231 may be formed on the planarization layer 215, and be electrically connected to the source and drain electrodes 223 via a contact hole 230 formed in the planarization layer 215.

The pixel electrode 231 may be a reflective electrode, and may include a reflecting layer formed of Ag, magnesium (Mg), Al, Pt, Pd, Au, Ni, neodymium (Nd), iridium (Ir), chromium (Cr), or a compound thereof, and a transparent or semi-transparent electrode layer formed on the reflecting layer. The transparent or semi-transparent electrode layer may include at least one of indium tin oxide (ITO), indium zinc oxide (IZO), zinc oxide (ZnO), indium oxide ($In_2O_3$), or indium gallium oxide (IGO).

The opposite electrode 233 is provided to face the pixel electrode 231. The opposite electrode 233 may be a transparent or semi-transparent electrode, and may be formed of a metal thin film having a low work function which includes lithium (Li), calcium (Ca), LiF/Ca, LiF/Al, Al, Ag, Mg, or a compound thereof. Also, an auxiliary electrode layer or a bus electrode may be further formed on the metal thin film by using a material for forming a transparent electrode such as ITO, IZO, ZnO, or $In_2O_3$.

Therefore, the opposite electrode 233 may transmit light emitted from an organic light-emitting layer (not shown) included in the intermediate layer 232. In other words, the light emitted from the organic light-emitting layer may be discharged toward the opposite electrode 233, or may be reflected by the pixel electrode 231, which is a reflective electrode, toward the opposite electrode 233.

However, the organic light-emitting display apparatus 10 according to the present embodiment is not limited to a top-emission type, but may be a bottom-emission type in which the light emitted from the organic light-emitting layer is emitted toward the substrate 100. In this case, the pixel electrode 231 may be a transparent or semi-transparent electrode, and the opposite electrode 233 may be a reflective electrode. Also, the organic light-emitting display apparatus 10 may be a dual emission type in which light is emitted from both the front and rear surfaces.

The pixel defining layer 216 may be formed on the pixel electrode 231 by using an insulating material. The pixel defining layer 216 may be formed of at least one organic insulating material of polyimide, polyamide, acrylic resin, benzocyclobutene, or phenolic resin. The pixel defining layer 216 may be formed using a method such as a spin coating. The pixel defining layer 216 exposes a predetermined area of the pixel electrode 231. The intermediate layer 232 which includes the organic light-emitting layer may be provided on the exposed area.

The organic light-emitting layer may be formed of a low molecular weight organic material or a high molecular weight organic material. In addition to the organic light-emitting layer, the intermediate layer 232 may selectively further include functional layers such as a hole transport layer (HTL), a hole injection layer (HIL), an electron transport layer (ETL), or an electron injection layer (EIL).

Referring back to FIG. 1, the encapsulating layer 300 may be formed to cover an entire surface of the display unit 200, and protects the display unit 200 from external moisture and oxygen. In particular, the area of the encapsulating layer 300 may be greater than the area of the display unit 200. Therefore, the boundary of the encapsulating layer 300 may contact the substrate 100, and thus the external impurities may be more securely blocked by the encapsulating layer 300.

The encapsulating layer 300 may be formed of a low temperature viscosity transition (LVT) inorganic material, and may include nitrogen.

Here, a "viscosity transition temperature" means a minimum temperature at which the LVT inorganic material becomes fluid. The viscosity transition temperature may be lower than a denaturalization temperature of a material included in the OLED. Also, the "denaturalization temperature of a material included in the OLED" may denote a temperature that causes the material included in the OLED to be chemically and/or physically denaturalized. For example, the "denaturalization temperature of a material included in the OLED" may be a glass transition temperature ($T_g$) of an organic material in the intermediate layer 232 of the OLED. That is, the $T_g$ may be derived from a result obtained by performing a thermal analysis using a thermo gravimetric analysis (TGA) method and differential scanning calorimetry (DSC) method with respect to a material included in the OLED. The thermal analysis may be performed in an $N_2$ atmosphere. Also, in the TGA method, a temperature ranging from room temperature to 600° C. (10° C./min), and in the DSC method, the temperature ranging from room temperature to 400° C. In the TGA method, a pan was a Pt pan in a disposable Al pan, and in the DSC method, the pan was a disposable Al pan. The $T_g$ may be easily recognized by those of ordinary skill in the art The denaturalization temperature of a material included in the OLED may exceed about 130° C., for example, but is not limited thereto. The denaturalization temperature thereof may be measured by performing the aforementioned TGA on the material included in the OLED.

The viscosity transition temperature of the LVT inorganic material may be about 80° C. or above, for example, about 80° C. to about 130° C., but is not limited thereto. Also, the viscosity transition temperature of the LVT inorganic material may be about 80° C. to about 120° C., or about 100° C. to about 120° C., but is not limited thereto.

The LVT inorganic material may be a mixture of one type of compounds, or two or more types of compounds.

The LVT inorganic material may include tin oxide such as SnO or $SnO_2$. If the LVT inorganic material includes SnO, the amount of SnO may be about 20% by weight (hereinafter, wt %) to about 100 wt %.

Also, the LVT inorganic material may further include at least one type of compound from the group of phosphorous oxide such as $P_2O_5$, boron phosphate ($BPO_4$), tin fluoride such as $SnF_2$, niobium oxide such as NbO, or tungsten such as $WO_3$, but is not limited thereto.

For example, the LVT inorganic material may include SnO; SnO and $P_2O_5$;

SnO and $BPO_4$; SnO, $SnF_2$ and $P_2O_5$; SnO, $SnF_2$, $P_2O_5$ and NbO; or SnO, $SnF_2$, $P_2O_5$ and $WO_3$, but is not limited thereto.

For example, the LVT inorganic material may have one of the following compositions, but is not limited thereto:

SnO (100 wt %);

SnO (80 wt %) and $P_2O_5$ (20 wt %);

SnO (90 wt %) and $BPO_4$ (10 wt %);

SnO (20-50 wt %), $SnF_2$ (30-60 wt %) and $P_2O_5$ (10-30 wt %) (here, the total weight of SnO, $SnF_2$ and $P_2O_5$ is 100 wt %);

SnO (20-50 wt %), $SnF_2$ (30-60 wt %), $P_2O_5$ (10-30 wt %) and NbO (1-5 wt %) (the total weight of SnO, $SnF_2$, $P_2O_5$ and NbO is 100 wt %); or SnO (20-50 wt %), $SnF_2$ (30-60 wt %), $P_2O_5$ (10-30 wt %) and $WO_3$ (1-5 wt %) (here, the total weight of SnO, $SnF_2$, $P_2O_5$ and $WO_3$ is 100 wt %).

For example, the LVT inorganic material may include SnO (42.5 wt %), $SnF_2$ (40 wt %), $P_2O_5$ (15 wt %) and $WO_3$ (2.5 wt %), but is not limited thereto.

Hereinafter, a method of forming the encapsulating layer 300 will be described in more detail.

The encapsulating layer 300 may be formed by forming a preliminary layer (not shown) of the LVT inorganic material on the display unit 200 and then, healing the deposited preliminary layer. The preliminary layer of the LVT inorganic material may be formed using a sputtering method, a vacuum deposition method, a low temperature deposition method, a plasma enhanced chemical vapor deposition (PCVD) method, a plasma ion assisted deposition (PIAD) method, an electron beam coating method, or an ion plating method.

For example, the preliminary layer of the LVT inorganic material may be formed using a sputtering method that uses a target having a SnO—$SnF_2$—$P_2O_5$—$WO_3$ composition. In the sputtering method, a dual rotary target may be used, and may be scanned as the substrate 100 moves.

During sputtering, argon gas and nitrogen gas are injected together. When nitrogen gas is injected during sputtering, impurities such as carbon included in the target or in the preliminary layer of the LVT inorganic material may be removed by the nitrogen gas. Since the impurities such as carbon reduce a light-transmission rate, the impurities such as carbon may be removed by injecting nitrogen gas, thereby increasing the light-transmission level of the encapsulating layer 300. Also, since the nitrogen gas is included in the encapsulating layer 300 as it is injected during sputtering, a compressive stress of the encapsulating layer 300 may be reduced.

Injecting nitrogen gas and argon gas together during sputtering means that the sputter deposition process may be performed under a condition in which oxygen may be non-existent. If the sputter deposition method is used under the oxygen-free condition, the organic light-emitting layer of the OLED and the opposite electrode 233 may be prevented from being oxidized during the sputter deposition process.

The ratio of the amount of injected nitrogen gas to that of injected argon gas ranges from about 0.005:1 to about 0.1:1. If the ratio thereof is less than about 0.005:1, impurities such as carbon may not be removed effectively and thus the light transmission rate of the encapsulating layer 300 may be reduced. On the other hand, if the ratio thereof is more than about 0.1:1, the density of the encapsulating layer 300 may be reduced, and thus the barrier performance of the encapsulating layer 300 may be reduced. Therefore, the preferable ratio of the injection amount of nitrogen gas to that of argon gas is about 0.005:1 to about 0.1:1.

However, the present invention is not limited thereto. That is, to improve the light-transmission rate of the encapsulating layer 300, oxygen may also be injected by less than 5% with respect to the entire injection amount of gas.

The preliminary layer of the LVT inorganic material, which is formed using the method described above, may include defects such as pin holes. The pin holes may serve as a moving passage for external impurities such as moisture or oxygen. Thus, the pin holes may be a cause of a progressive dim spot, and accordingly, reduce the lifespan of the organic light-emitting apparatus. Therefore, when the preliminary layer of the LVT inorganic material is formed on the display unit 200, a healing process is executed to remove defects such as the pin holes.

The healing process is executed at a temperature higher than or equal to the viscosity transition temperature of the LVT inorganic material. For example, the healing process may be achieved by heat treating on the LVT inorganic material in a range from a viscosity transition temperature to a temperature below the denaturalization temperature of a material included in the OLED. Here, the "viscosity transition temperature of the LVT inorganic material" may vary according to the composition of the LVT inorganic material. Also, the "denaturalization temperature of a material included in the OLED" may vary according to the material included in the OLED. However, the denaturalization temperature thereof may be recognized by one of ordinary skill in the art according to the composition of the LVT inorganic material and the material included in the OLED. For example, the denaturalization temperature thereof may be recognized by evaluating $T_g$ derived from a result of a TGA performed on a material included in the OLED.

For example, the healing process may be achieved by heat treating on the preliminary layer of the LVT inorganic material in a temperature range from about 80° C. to about 130° C. for about 1 hour to about 3 hours (for example, at 110° C. for 2 hours). However, the present invention is not limited thereto. When the temperature of the healing process satisfies the temperature range of the heat treatment the preliminary layer of the LVT inorganic material may be fluidized, thus preventing the OLED from denaturalizing.

Also, to prevent the OLED from being exposed to external impurities via the pin holes of the preliminary layer of the LVT inorganic material, the healing process may be executed in an infrared (IR) oven under a vacuum atmosphere or an inert gas atmosphere (such as $N_2$ atmosphere, argon (Ar) gas atmosphere, and the like).

By executing the healing process as described above, the preliminary layer of the LVT inorganic material may be fluidized. Therefore, during the healing process, the fluidized LVT inorganic material may flow into the pin holes of the preliminary layer of the LVT material and be filled therein. Consequently, the defects of the preliminary layer of the LVT inorganic material may be removed, and the encapsulating layer 300 having a dense layer quality may be formed.

The LVT inorganic material included in the encapsulating layer 300 may be combined with oxygen in the air. Therefore, the surface region of the encapsulating layer 300 includes relatively more $SnO_2$ than the other regions, and a region closer to the display unit 200 includes relatively more SnO. The $SnO_2$ included in the encapsulating layer 300 may enhance the density and light-transmission rate of the encapsulating layer 300.

Figure 3:
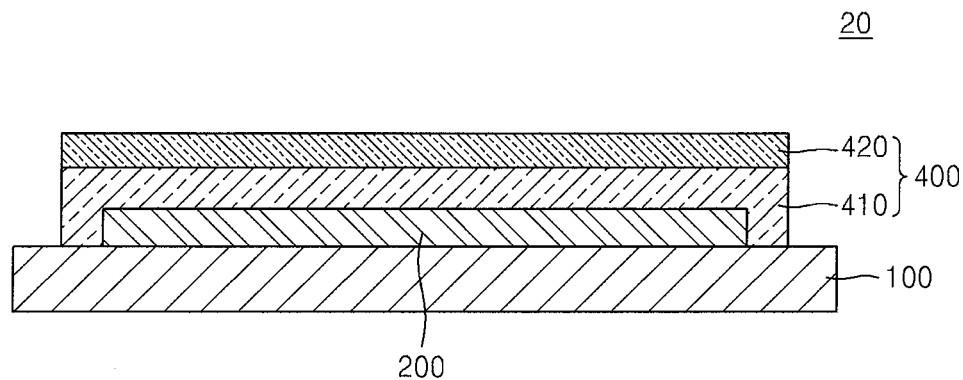
FIG. 3 is a cross-sectional view illustrating an organic light-emitting display apparatus according to another embodiment of the present invention.
Figure 4:
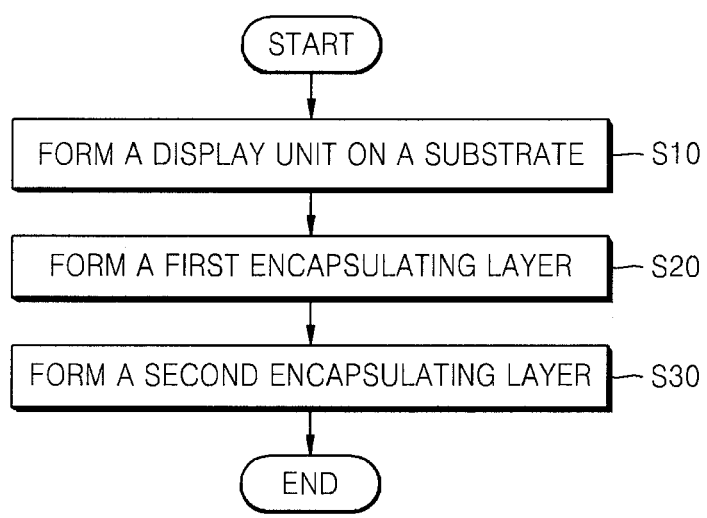
FIG. 4 is a flowchart illustrating a method of manufacturing the organic light-emitting display apparatus of FIG. 3.

FIG. 3 is a cross-sectional view illustrating an organic light-emitting display apparatus 20 according to another embodiment of the present invention. FIG. 4 is a flowchart illustrating a method of manufacturing the organic light-emitting display apparatus 20 of FIG. 3.

Referring to FIG. 3, the organic light-emitting display apparatus 20 may include a substrate 100, a display unit 200 formed on the substrate 100, and an encapsulating layer 400 encapsulating the display unit 200.

The substrate 100 and display unit 200 are similar to the substrate 100 and display unit 200 illustrated in and described above with reference to FIGS. 1 and 2. Therefore, the detailed description thereof will be omitted.

The encapsulating layer 400 may include a first encapsulating layer 410 and second encapsulating layer 420 that are sequentially stacked on the display unit 200.

The first encapsulating layer 410 is similar to the encapsulating layer 300 described above with reference to FIG. 1. That is, the first encapsulating layer 410 may be formed of an LVT inorganic material. Also, the first encapsulating layer 410 may include nitrogen, and thus the compressive stress of the first encapsulating layer 410 may be reduced.

The second encapsulating layer 420 may be formed of an LVT inorganic material which includes one type of compounds or two or more types of compounds. The second encapsulating layer 420 may include more $SnO_2$ than the first encapsulating layer 410 and thus may have an enhanced layer density and provide an increased light-transmission rate.

Hereinafter, the method of manufacturing the organic light-emitting display apparatus 20 will be described with reference to FIG. 4.

The method of manufacturing the organic light-emitting display apparatus 20 includes operation S10 of forming the display unit 200 on the substrate 100; operation S20 of forming the first encapsulating layer 410 on the display unit 200; and operation S30 of forming the second encapsulating layer 420 on the first encapsulating layer 410.

The display unit 200 is similar to the display unit 200 of FIG. 2, and various commonly known organic light-emitting displays may be used for the display unit 200. Thus, a detailed description of a method of manufacturing the display unit 200 will be omitted.

The first and second encapsulating layers 410 and 420 may be formed by depositing an LVT material on the display unit 200 using sputter deposition, vacuum deposition, low temperature deposition, plasma enhanced chemical vapor deposition (PCVD), plasma ion assisted deposition (PIAD), electron beam coating, or ion plating, and then, healing the deposited LVT inorganic material.

For example, the first and second encapsulating layers 410 and 420 may be formed using the sputtering method that uses a target having a $SnO$—$SnF_2$—$P_2O_5$—$WO_3$ composition. In the sputtering method, a dual rotary target may be used, and may be scanned as the substrate 100 moves.

The first encapsulating layer 410 is similar to the encapsulating layer 300 of FIG. 1. The first encapsulating layer 410 is formed by injecting argon gas and nitrogen gas together during sputtering. When nitrogen gas is injected during sputtering, nitrogen removes impurities such as carbon which reduce a light-transmission rate, and thus the light-transmission rate of the first encapsulating layer 410 may be enhanced. Also, since the sputtering is executed under a condition in which oxygen is non-existent, the organic light-emitting layer of the OLED and the opposite electrode 233 may not be oxidized.

The first encapsulating layer 410 may include $SnO_2$. However, the amount of $SnO_2$ in the first encapsulating layer 410 may be relatively larger in the surface region of the encapsulating layer 410 than in the region thereof which is closer to the display unit 200.

The second encapsulating layer 420 may be formed by injecting argon gas and oxygen gas together during the sputtering deposition process. The ratio of the injection amount of oxygen gas to that of argon gas may be about 0.005:1 to about 1:1. Since the first encapsulating layer 410 serves as a barrier layer which protects the organic light-emitting layer of the OLED and the opposite electrode 233 from being oxidized, the injection amount of oxygen may be increased when forming the second encapsulating layer 420. Thus, $SnO_2$, which is formed when SnO is oxidized, may be included more in the second encapsulating layer 420 than in the first encapsulating layer 410. $SnO_2$ may enhance the film density and light-transmission rate of the second encapsulating layer 420.

Since the first encapsulating layer 410 serves as a barrier layer which protects the organic light-emitting layer of the OLED and the opposite electrode 233 from being oxidized, the first encapsulating layer 410 may be formed in a thickness enough to achieve the barrier function. Therefore, since a thickness of the second encapsulating layer 420 may reflectively increase (for example, may be formed to be thicker than the first encapsulating layer 410), the barrier characteristics and the light-transmission rate of the encapsulating layer 400 may be enhanced.

The healing process is similar to the process illustrated and described with reference to FIG. 1. The healing process may be separately executed on the first and second encapsulating layers 410 and 420, or, the healing process may be executed simultaneously on the first and second encapsulating layers 410 and 420.

The healing process may not necessary include one operation, but may include a plurality of operations. Also, the healing process may be followed by a post-treatment process such as chemical treatment, plasma treatment, treatment using a high temperature chamber including oxygen, treatment using a high temperature chamber including oxygen and moisture, or surface doping. By executing the post-treatment process, the first and second encapsulating layers 410 and 420 on which the healing process has been executed may be more securely fixed.

According to one or more embodiments of the present invention, an encapsulating layer improved in transmitting light and encapsulating an organic light-emitting device may be provided. Thus, an organic light-emitting display apparatus may be more reliable.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a substrate;
a display unit on the substrate; and
an encapsulating layer covering an entire surface of the display unit and encapsulating the display unit,
wherein the encapsulating layer is formed of a low-temperature viscosity transition inorganic material having a viscosity transition temperature in a range of 80 degrees C. to 130 degrees C.; and
wherein the encapsulating layer comprises nitrogen.

2. The organic light-emitting display apparatus of claim 1, wherein the encapsulating layer comprises tin oxide.

3. The organic light-emitting display apparatus of claim 1, wherein the encapsulating layer further comprises at least one of $P_2O_5$, $BPO_4$, $SnF_2$, or $WO_3$.

4. The organic light-emitting display apparatus of claim 2, wherein the tin oxide is $SnO_2$, and the amount of $SnO_2$ is larger at a surface of the encapsulating layer than at a region near the display unit.

5. The organic light-emitting display apparatus of claim 1, wherein the encapsulating layer is also formed on the substrate.

6. The organic light-emitting display apparatus of claim 1,
   wherein the encapsulating layer comprises a first encapsulating layer and second encapsulating layer that are sequentially stacked;
   wherein the first and second encapsulating layers are formed of the low-temperature viscosity transition inorganic material; and
   wherein the first encapsulating layer comprises the nitrogen.

7. The organic light-emitting display apparatus of claim 6, wherein the first and second encapsulating layers comprise tin oxide.

8. The organic light-emitting display apparatus of claim 7, wherein the tin oxide is $SnO_2$, and the amount of $SnO_2$ in the second encapsulating layer is larger than that in the first encapsulating layer.

9. The organic light-emitting display apparatus of claim 6, wherein a thickness of the second encapsulating layer is greater than a thickness of the first encapsulating layer.

\* \* \* \* \*